United States Patent
Kurihara et al.

(10) Patent No.: US 10,250,223 B2
(45) Date of Patent: Apr. 2, 2019

(54) ACOUSTIC WAVE DEVICE

(71) Applicant: TAIYO YUDEN CO., LTD., Tokyo (JP)

(72) Inventors: Tomoyuki Kurihara, Tokyo (JP); Kazushige Hatakeyama, Tokyo (JP); Takuma Kuroyanagi, Tokyo (JP); Yohei Shimizu, Tokyo (JP); Masahiro Sato, Tokyo (JP); Naoki Kakita, Tokyo (JP); Kazutaka Suzuki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 94 days.

(21) Appl. No.: 15/451,684

(22) Filed: Mar. 7, 2017

(65) Prior Publication Data
US 2017/0272051 A1 Sep. 21, 2017

(30) Foreign Application Priority Data
Mar. 17, 2016 (JP) .................... 2016-054430

(51) Int. Cl.
*H03H 9/10* (2006.01)
*H03H 9/02* (2006.01)
(Continued)

(52) U.S. Cl.
CPC ............ *H03H 9/1071* (2013.01); *H03H 3/08* (2013.01); *H03H 9/02984* (2013.01);
(Continued)

(58) Field of Classification Search
CPC ........ H03H 3/02; H03H 3/08; H03H 9/02559; H03H 9/02574; H03H 9/02992;
(Continued)

(56) References Cited

U.S. PATENT DOCUMENTS 4,803,449 A * 2/1989 Hikita ................ H03H 9/02755
310/313 R
5,438,305 A * 8/1995 Hikita .................... H01L 23/66
174/551
(Continued)

FOREIGN PATENT DOCUMENTS

JP 2001345673 A * 12/2001
JP 2004-71938 A 3/2004
(Continued)

OTHER PUBLICATIONS

"AZO Material", https://www.azom.com/properties.aspx?ArticleID=52, accessed on Aug. 3, 2018.*
(Continued)

*Primary Examiner* — Robert J Pascal
*Assistant Examiner* — Jorge L Salazar, Jr.
(74) *Attorney, Agent, or Firm* — Chen Yoshimura LLP

(57) ABSTRACT

An acoustic wave device includes: a first substrate including a support substrate and a piezoelectric substrate bonded on an upper surface of the support substrate, and including a first acoustic wave element located on an upper surface of the piezoelectric substrate; a ring-shaped metal layer located in a region that surrounds the first acoustic wave element and in which the piezoelectric substrate is removed, a second substrate flip-chip mounted on an upper surface of the first substrate and including a functional element located on a lower surface of the second substrate; and a metallic member located on an upper surface of the ring-shaped metal layer, surrounding the second substrate in plan view, not located between the first substrate and the second substrate, and sealing the first acoustic wave element and the functional element so that the first acoustic wave element and the functional element are located across an air gap.

11 Claims, 15 Drawing Sheets

(51) Int. Cl.
  *H03H 3/08* (2006.01)
  *H03H 9/05* (2006.01)
  *H03H 9/64* (2006.01)

(52) U.S. Cl.
  CPC ........ *H03H 9/0547* (2013.01); *H03H 9/1014* (2013.01); *H03H 9/1064* (2013.01); *H03H 9/6483* (2013.01); *H01L 2224/16225* (2013.01)

(58) Field of Classification Search
  CPC .. H03H 9/0547; H03H 9/0571; H03H 9/0576; H03H 9/059; H03H 9/1007; H03H 9/1064; H03H 9/1071; H03H 9/25; H03H 9/1014; H03H 9/1092; H03H 9/02984; H03H 9/6483; H01L 2224/16225
  USPC .......................... 333/133, 187, 188, 193–196
  See application file for complete search history.

(56) References Cited

U.S. PATENT DOCUMENTS 7,274,129 B2 * 9/2007 Ueda .................. H03H 3/10
                                                310/313 R 2009/0224851 A1  9/2009  Feiertag et al.
2015/0036304 A1  2/2015  Yamauchi et al.

FOREIGN PATENT DOCUMENTS

| JP | 2006-246112 A | 9/2006 |
| JP | 2008-546207 A | 12/2008 |
| JP | 2015-32634 A | 2/2015 |
| JP | 2015-91065 A | 5/2015 |
| JP | 2015-130601 A | 7/2015 |
| WO | 2014/17514 A1 | 1/2014 |

OTHER PUBLICATIONS

"Korth Kristalle GMBH", https://www.korth.de/index.php/162/items/20.html, accessed on Aug. 3, 2018.*
Machine English Translation of JP2001345673A, Published on Dec. 14, 2001.*
U.S. Appl. No. 15/430,818, filed Feb. 13, 2017.
Japanese Office Action dated Mar. 13, 2018, in a counterpart Japanese patent application No. 2016-037288.

* cited by examiner

ACOUSTIC WAVE DEVICE

CROSS-REFERENCE TO RELATED APPLICATION

This application is based upon and claims the benefit of priority of the prior Japanese Patent Application No. 2016-054430, filed on Mar. 17, 2016, the entire contents of which are incorporated herein by reference.

FIELD

A certain aspect of the present invention relates to an acoustic wave device.

BACKGROUND

As a packaging method of an acoustic wave device, there has been known a method that face-down mounts a chip on a circuit board, and then covers the periphery of the chip by a sealing member. The integration and downsizing of the acoustic wave device have been desired. Japanese Patent Application Publication No. 2008-546207 (Patent Document 1) describes that two substrates each including an acoustic wave element formed on the surface thereof are bonded together through an interlayer so that the acoustic wave elements face each other across an air gap.

In the method that stacks the substrates each including a functional element such as an acoustic wave element formed thereon as described in Patent Document 1, the stress between the substrates becomes an issue. For example, the thermal stress between the substrates causes the strain of the substrate. The strain of the substrate deteriorates the characteristics of the functional element. In addition, when the stress between the substrates is intended to be reduced, the heat release performance from the acoustic wave elements or the like decreases.

SUMMARY OF THE INVENTION

According to an aspect of the present invention, there is provided an acoustic wave device including: a first substrate that includes a support substrate and a piezoelectric substrate bonded on an upper surface of the support substrate, and includes a first acoustic wave element located on an upper surface of the piezoelectric substrate; a ring-shaped metal layer located in a region that surrounds the first acoustic wave element and in which the piezoelectric substrate is removed; a second substrate that is flip-chip mounted on an upper surface of the first substrate and includes a functional element located on a lower surface of the second substrate; and a metallic member that is located on an upper surface of the ring-shaped metal layer, surrounds the second substrate in plan view, is not located between the first substrate and the second substrate, and seals the first acoustic wave element and the functional element so that the first acoustic wave element and the functional element are located across an air gap.

DETAILED DESCRIPTION

Hereinafter, a description will be given of embodiments of the present invention with reference to the accompanying drawings.

First Embodiment

Figure 1:
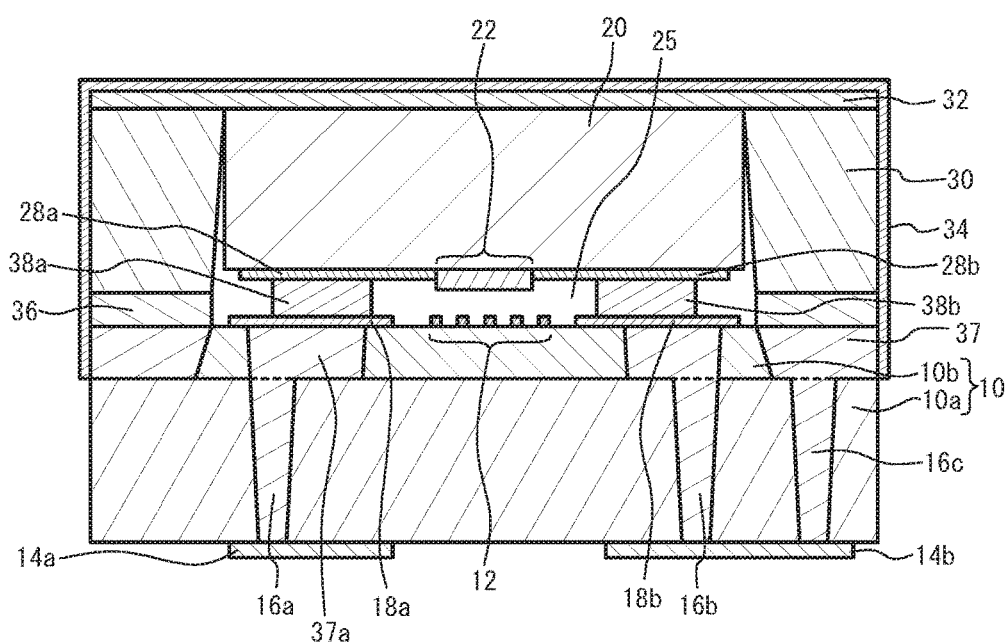
FIG. 1 is a cross-sectional view of an acoustic wave device in accordance with a first embodiment.

FIG. 1 is a cross-sectional view of an acoustic wave device in accordance with a first embodiment. As illustrated in FIG. 1, a substrate 10 includes a support substrate 10a and a piezoelectric substrate 10b. The support substrate 10a is, for example, a sapphire substrate, an alumina substrate, a spinel substrate, or a silicon substrate. The piezoelectric substrate 10b is, for example, a tantalum lithium substrate or a lithium niobate substrate. The piezoelectric substrate 10b is bonded on the upper surface of the support substrate 10a. Terminals 14a and 14b are formed on the lower surface of the substrate 10. The terminals 14a and 14b are foot pads for connecting functional elements 12 and 22 to external devices. The functional element 12 and wiring lines 18a and 18b are located on the upper surface of the substrate 10. Via wirings 16a through 16c penetrating through the substrate 10 are located. The terminals 14a and 14b, the via wirings 16a through 16c, and the wiring lines 18a and 18b are formed of a metal layer such as, for example, a copper layer, an aluminum layer, or a gold layer.

The via wirings 16a and 16b electrically connect the wiring lines 18a and 18b and the terminals 14a and 14b, respectively. In the outer periphery of the substrate 10, the piezoelectric substrate 10b is removed, and a ring-shaped metal layer 37 is located on the support substrate 10a. In a region located away from the ring-shaped metal layer 37, the piezoelectric substrate 10b is removed so as to form island-shaped patterns, and an island metal layer 37a is formed. The wiring lines 18a and 18b are coupled to the island metal layer 37a. The via wirings 16a and 16b are coupled to the island metal layer 37a. The film thicknesses of the ring-shaped metal layer 37 and the island metal layer 37a are the same as, for example, that of the piezoelectric substrate 10b. The ring-shaped metal layer 37 and the island metal layer 37a are, for example, a copper layer, an aluminum layer, or a gold layer. A ring-shaped electrode 36 is formed on the ring-shaped metal layer 37. The ring-shaped electrode 36 is formed of a metal layer such as a nickel layer, a copper layer, an aluminum layer, or a gold layer. When the upper surface of the ring-shaped metal layer 37 has a good solderability, the ring-shaped electrode 36 may not necessarily be provided.

The functional element 22 and wiring lines 28a and 28b are located on the lower surface of the substrate 20. The substrate 20 is, for example, an insulating substrate such as a glass substrate or a semiconductor substrate such as a silicon substrate. The wiring lines 28a and 28b are formed of a metal layer such as, for example, a copper layer, an aluminum layer, or a gold layer. The substrate 20 is flip-chip mounted (face-down mounted) on the substrate 10 through bumps 38a and 38b. The bumps 38a and 38b are, for example, gold bumps, solder bumps, or copper bumps. The bump 38a bonds the wiring lines 28a and 18a together, and the bump 38b bonds the wiring line 28b and the wiring line 18b together.

A sealing member 30 is located on the substrate 10 so as to surround the substrate 20. The sealing member 30 is made of a metallic material such as solder. The sealing member 30 is bonded to the ring-shaped electrode 36. The sealing member 30 is not bonded to the side surface of the substrate 20. A flat plate-like lid 32 is located on the upper surface of the substrate 20 and the upper surface of the sealing member 30. The lid 32 is made of, for example, a metal plate or an insulating plate. A protective film 34 is located so as to cover the lid 32 and the sealing member 30. The protective film 34 is a metal film or an insulating film.

The functional elements 12 and 22 face each other across an air gap 25. The air gap 25 is sealed by the sealing member 30, the substrate 10, the substrate 20, and the lid 32. The bumps 38a and 38b are surrounded by the air gap 25.

The terminal 14a is electrically connected to the functional element 12 through the via wiring 16a, the island metal layer 37a, and the wiring line 18a. The terminal 14a is also electrically connected to the functional element 22 through the via wiring 16a, the island metal layer 37a, the wiring line 18a, the bump 38a, and the wiring line 28a. The terminal 14b is electrically connected to the functional element 12 through the via wiring 16b, the island metal layer 37a, and the wiring line 18b, and is also electrically connected to the functional element 22 through the via wiring 16b, the island metal layer 37a, the wiring line 18b, the bump 38b, and the wiring line 28b. Furthermore, the terminal 14b is electrically connected to the sealing member 30 through the via wiring 16c and the ring-shaped metal layer 37. When a ground potential is supplied to the terminal 14b, the sealing member 30 is grounded.

Figure 2A:
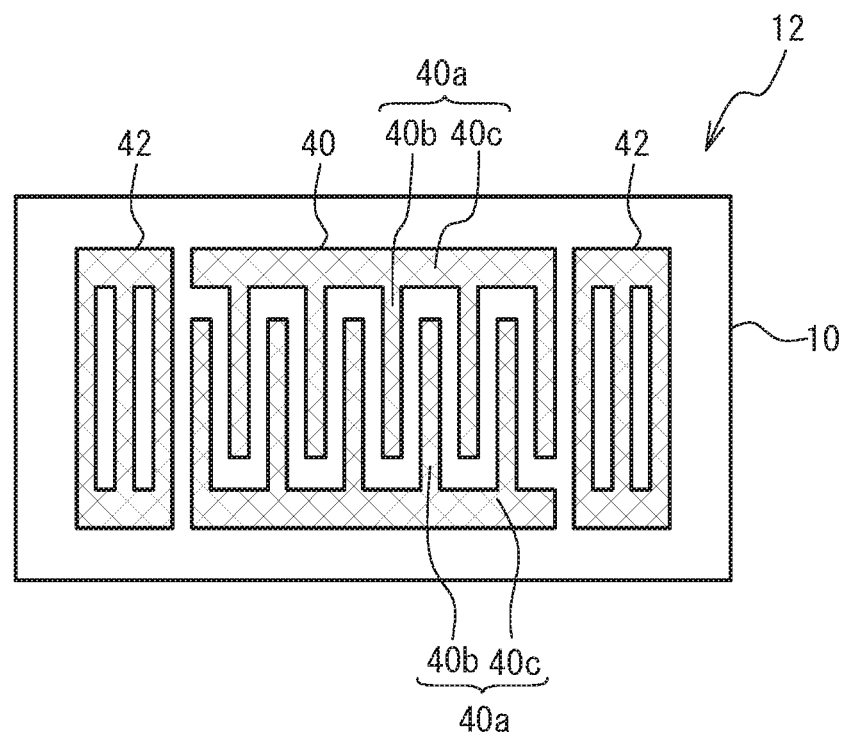
FIG. 2A is a plan view of a functional element 12.
Figure 2B:
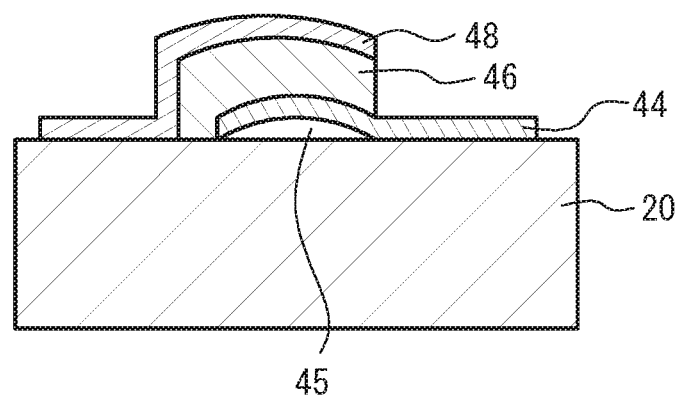
FIG. 2B is a cross-sectional view of a functional element 22.

FIG. 2A is a plan view of the functional element 12, and FIG. 2B is a cross-sectional view of the functional element 22. As illustrated in FIG. 2A, the functional element 12 is a surface acoustic wave resonator. An Interdigital Transducer (IDT) 40 and reflectors 42 are formed on the substrate 10. The IDT 40 includes a pair of comb-shaped electrodes 40a facing each other. The comb-shaped electrode 40a includes electrode fingers 40b and a bus bar 40c to which the electrode fingers 40b are connected. The reflectors 42 are located at both sides of the IDT 40. The IDT 40 excites a surface acoustic wave on the piezoelectric substrate 10b. The piezoelectric substrate 10b is, for example, a tantalum lithium substrate or a lithium niobate substrate. The IDT 40 and the reflectors 42 are formed of, for example, an aluminum film or a copper film.

As illustrated in FIG. 2B, the functional element 22 is a piezoelectric thin film resonator. A piezoelectric film 46 is located on the substrate 20. A lower electrode 44 and an upper electrode 48 are located so as to sandwich the piezoelectric film 46. An air gap 45 is formed between the lower electrode 44 and the substrate 20. The lower electrode 44 and the upper electrode 48 excite an acoustic wave in the thickness extension mode in the piezoelectric film 46. The lower electrode 44 and the upper electrode 48 are formed of, for example, a metal film such as a ruthenium film, and the piezoelectric film 46 is formed of, for example, an aluminum nitride film. The substrate 20 is an insulating substrate or a semiconductor substrate.

The functional elements 12 and 22 include electrodes exciting acoustic waves. Thus, the functional elements 12 and 22 are covered with the air gap 25 so as not to restrain the acoustic waves.

Hereinafter, exemplary materials and dimensions of the first embodiment will be described. The support substrate 10a is a sapphire substrate with a film thickness of 100 μm. The piezoelectric substrate 10b is a lithium tantalate substrate with a film thickness of 20 μm. When the support substrate 10a has a linear thermal expansion coefficient less than that of the piezoelectric substrate 10b, the frequency temperature dependence of the acoustic wave element of the functional element 12 becomes smaller. The ring-shaped metal layer 37 and the island metal layer 37a are a copper layer with a film thickness of 20 μm. The terminals 14a and 14b are formed of a copper layer with a film thickness of 2 μm, a nickel layer with a film thickness of 5 μm, and a gold layer with a film thickness of 0.5 μm stacked in this order from the support substrate 10a side. The via wirings 16a through 16c are copper via wirings. The ring-shaped electrode 36 is formed of a nickel layer with a film thickness of 5 μm. The bumps 38a and 38b are gold bumps. The substrate 20 is a silicon substrate. The sealing member 30 is made of SnAg solder. The lid 32 is made of a kovar plate with a film thickness of 15 μm. The protective film 34 is formed of a nickel layer with a film thickness of 10 μm.

Figure 3:
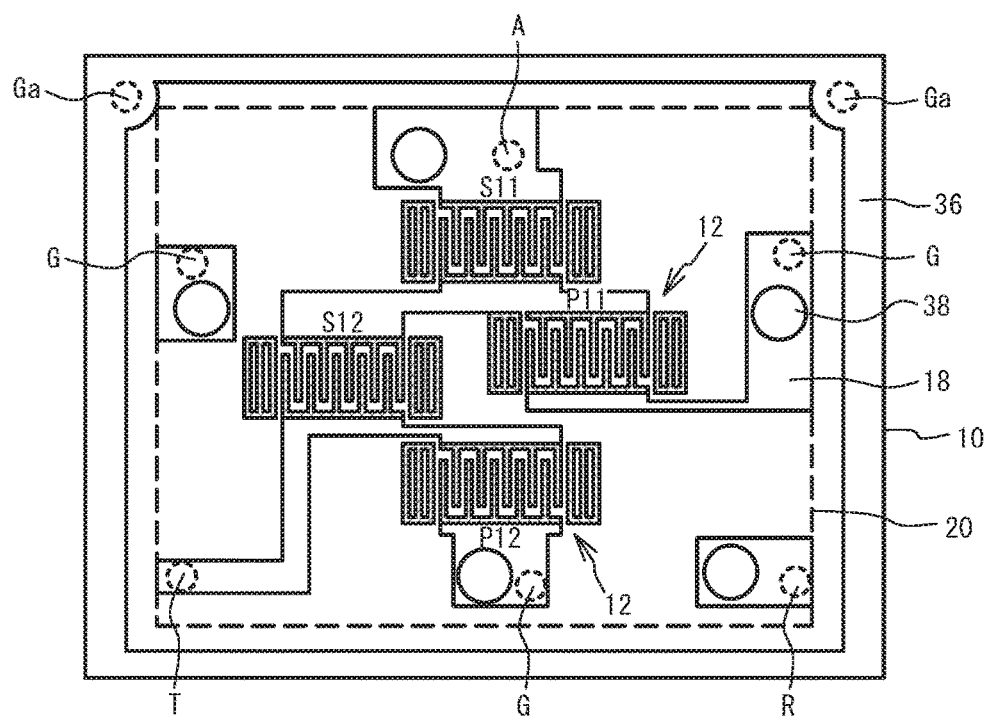
FIG. 3 is a plan view of a substrate 10 in the first embodiment.

FIG. 3 is a plan view of the substrate 10 in the first embodiment. As illustrated in FIG. 3, the functional elements 12, wiring lines 18 and the ring-shaped electrode 36 are located on the substrate 10. The functional elements 12 include series resonators S11 and S12 and parallel resonators P11 and P12. Bumps 38 are located on the wiring lines 18. Via wirings 16 connecting to the wiring lines 18 are formed in the substrate 10. The dashed line indicates the region to which the substrate 20 is to be mounted. The reference characters "A", "T", "R", and "G" respectively represent the via wirings 16 coupled to a common terminal, a transmit terminal, a receive terminal, and a ground terminal. The series resonators S11 and S12 are connected in series between a common terminal A and a transmit terminal T through the wiring lines 18. The parallel resonators P11 and P12 are connected in parallel between the common terminal A and the transmit terminal T through the wiring lines 18. The parallel resonators P11 and P12 are connected to ground terminals G through the wiring lines 18. As described above, a ladder-type filter as a transmit filter is located on the substrate 10.

Figure 4:
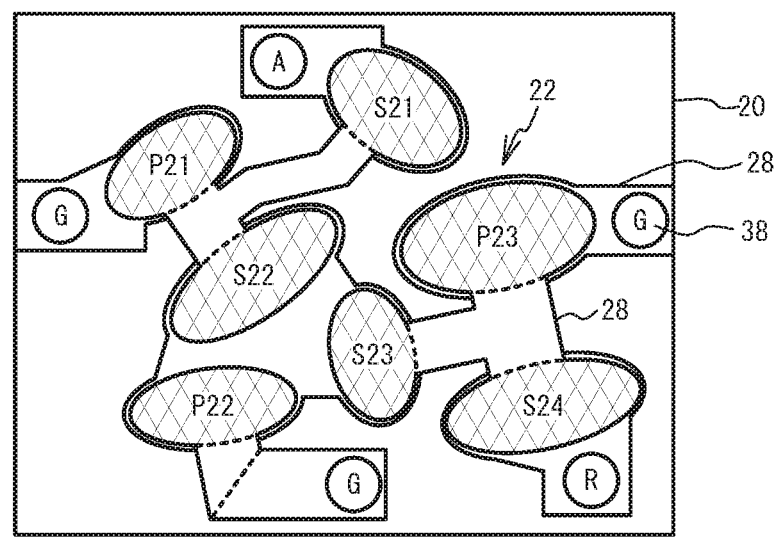
FIG. 4 is a plan view of a substrate 20 in the first embodiment.

FIG. 4 is a plan view of the substrate 20 in the first embodiment. To make the correspondence between FIG. 4 and FIG. 3 easier to understand, FIG. 4 is a plan view transparently viewed from above the substrate 20. As illustrated in FIG. 4, located on the substrate 20 (In FIG. 2, on the lower surface) are the functional elements 22, wiring lines 28, and the bumps 38. The reference characters "A", "R", and "G" respectively represent the bumps 38 coupled to the common terminal, the receive terminal, and the ground terminal. Series resonators S21 through S24 are connected in series between the common terminal A and a receive terminal R through the wiring lines 28. The parallel resonators P21 through P23 are connected in parallel between the common terminal A and the receive terminal R through the wiring lines 28. The parallel resonators P21 through P23 are connected to the ground terminals G through the wiring lines 28. As described above, a ladder-type filter as a receive filter is located on the substrate 20.

Figure 5:
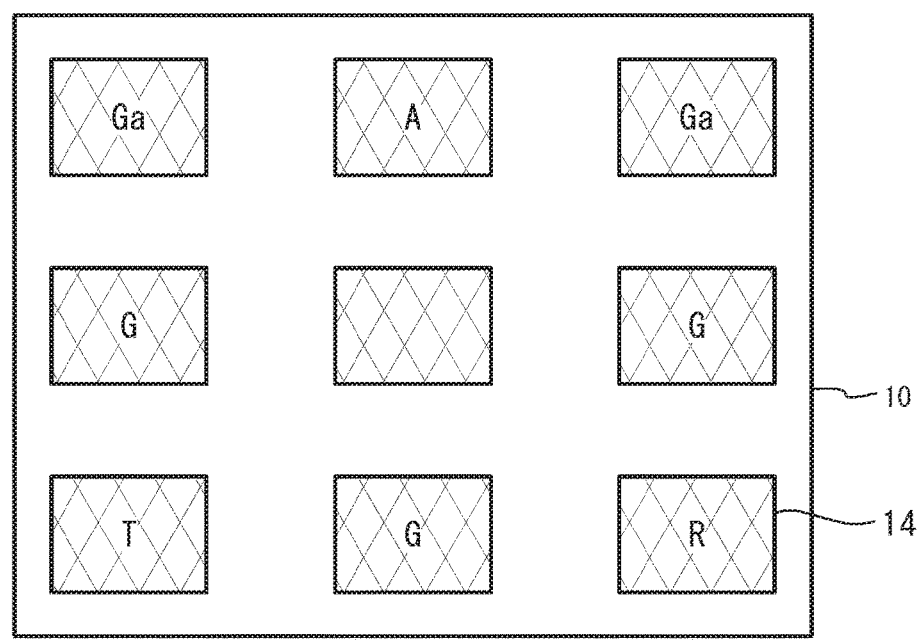
FIG. 5 is a plan view of the lower surface of the substrate 10 in the first embodiment.

FIG. 5 is a plan view of the lower surface of the substrate 10 in the first embodiment. To make the correspondence between FIG. 5 and FIG. 3 easier to understand, FIG. 5 is a plan view transparently viewed from above the substrate 10. Terminals 14 are located on the lower surface of the substrate 10. The reference characters "A", "T", "R", and "G" respectively represent the terminals 14 corresponding to the common terminal, the transmit terminal, the receive terminal, and the ground terminal. The common terminal A is electrically connected to the wiring line 18 through the via wiring 16, and is further electrically connected to the wiring line 28 through the bump 38. The transmit terminal T is electrically connected to the wiring line 18 through the via wiring 16. The receive terminal R is electrically connected to the wiring line 28 through the via wiring 16 and the bump 38. The ground terminal G is electrically connected to the wiring line 18 through the via wiring 16, and is further electrically connected to the wiring line 28 through the bump 38. Some ground terminals Ga are electrically connected to the ring-shaped electrode 36 through the via wirings 16.

As described above, the acoustic wave device of the first embodiment functions as a duplexer including: a transmit filter connected between the common terminal A and the transmit terminal T; and a receive filter connected between the common terminal A and the receive terminal R. The transmit filter transmits signals in the transmit band to the common terminal A among high-frequency signals input from the transmit terminal T, and suppresses other signals. The receive filter transmits signals in the receive band to the receive terminal R among high-frequency signals input from the common terminal A, and suppresses other signals. The first embodiment has described a duplexer as an example, but the filter located on the substrate 10 and the filter located on the substrate 20 may not necessarily be connected. An exemplary case where the receive filter and the transmit filter are ladder-type filters has been described, but one of the receive filter and the transmit filter may be a multimode type filter.

Figure 6A:
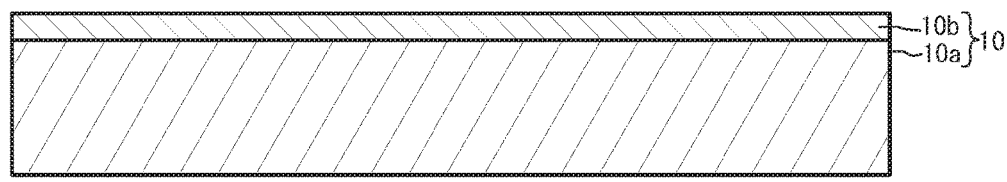
FIG. 6A through FIG. 6D are cross-sectional views (No. 1) illustrating a method of fabricating the acoustic wave device in accordance with the first embodiment.

FIG. 6A through FIG. 8C are cross-sectional views illustrating a method of fabricating the acoustic wave device in accordance with the first embodiment. FIG. 9 is a plan view in FIG. 6C. As illustrated in FIG. 6A, the lower surface of the piezoelectric substrate 10b is bonded onto the upper surface of the support substrate 10a. This bonding is performed in a wafer state. Examples of the bonding method include, but are not limited to, a method that activates the upper surface of the support substrate 10a and the lower surface of the piezoelectric substrate 10b and then bonds them together, and a method that bonds them with an adhesive agent.

Figure 6B:
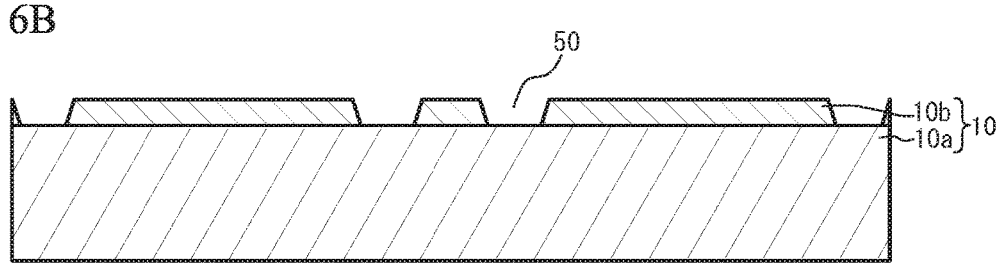

As illustrated in FIG. 6B, desired apertures 50 are formed in the piezoelectric substrate 10b. The apertures 50 are formed by, for example, blasting using a patterned photoresist as a mask. The apertures 50 may be formed by ion milling or wet etching instead of blasting.

Figure 6C:
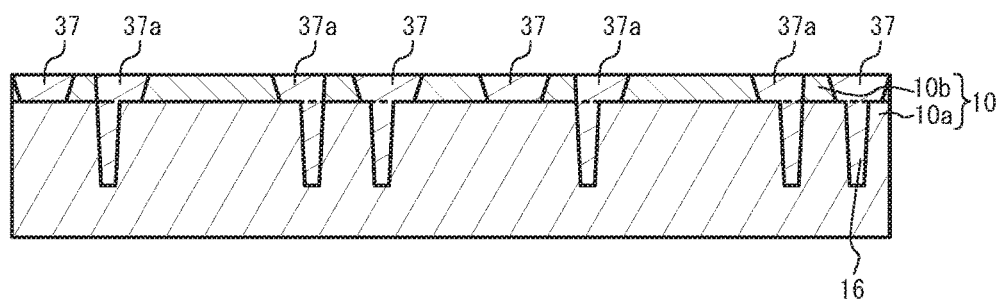

As illustrated in FIG. 6C, via holes are formed in the piezoelectric substrate 10b and the support substrate 10a. The via holes are formed by, for example, irradiating the piezoelectric substrate 10b and the support substrate 10a with a laser beam. A seed layer (not illustrated) is formed in the via holes and the apertures 50. An electric current is supplied to the seed layer, and the via wirings 16 are formed in the via holes and the island metal layer 37a and the ring-shaped metal layer 37 are formed in the apertures 50 by electrolytic plating. When the via wirings 16, the island metal layer 37a, and the ring-shaped metal layer 37 are formed of a copper layer, the seed layer may be formed of, for example, a titanium film with a film thickness of 100 µm and a copper layer with a film thickness of 200 µm stacked in this order from the substrate 10 side. Unnecessary plated layers are removed by Chemical Mechanical Polishing (CMP) or the like. This process makes the upper surface of the piezoelectric substrate 10b and the upper surface of the ring-shaped metal layer 37 substantially flat.

As illustrated in FIG. 9, the substrate 10 is, for example, in a wafer state, and regions 60 to be a plurality of chips are located on the substrate 10. Cut regions 62 are located between the regions 60. The ring-shaped metal layer 37 is located in the outer periphery of the region 60. The island metal layer 37a is formed in a region surrounded by the ring-shaped metal layer 37. The ring-shaped metal layer 37 is not located in the cut region 62.

Figure 6D:
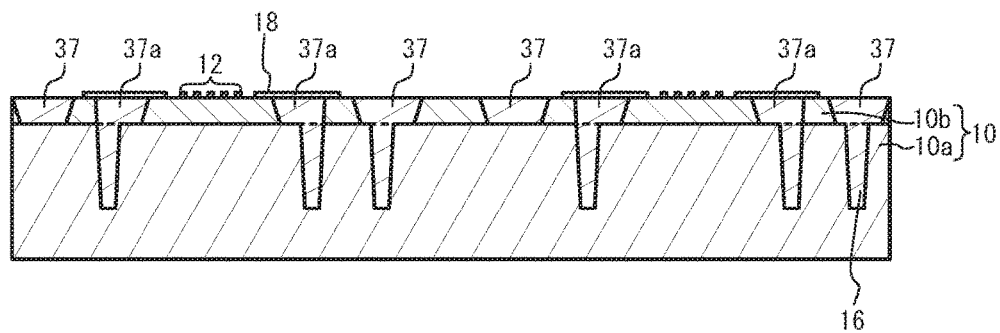

As illustrated in FIG. 6D, the functional elements 12 and the wiring lines 18 are formed on the upper surface of the piezoelectric substrate 10b. The functional elements 12 are formed of, for example, a titanium film and an aluminum film stacked in this order from the substrate 10 side. The wiring lines 18 are formed of, for example, a titanium film and a gold film stacked in this order from the substrate 10 side.

Figure 7A:
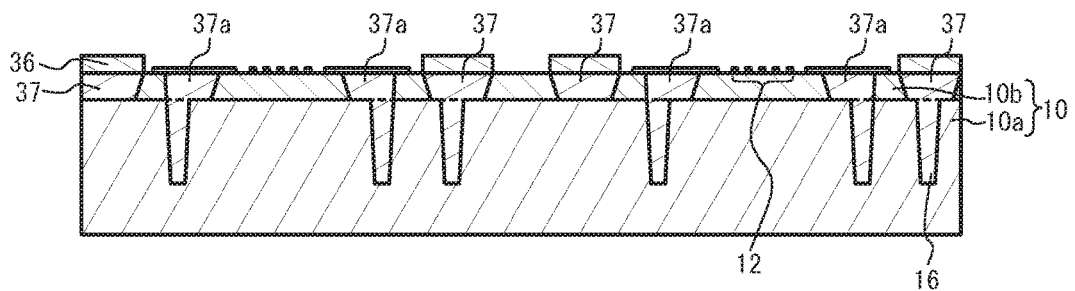
FIG. 7A through FIG. 7D are cross-sectional views (No. 2) illustrating the method of fabricating the acoustic wave device in accordance with the first embodiment.
Figure 7B:
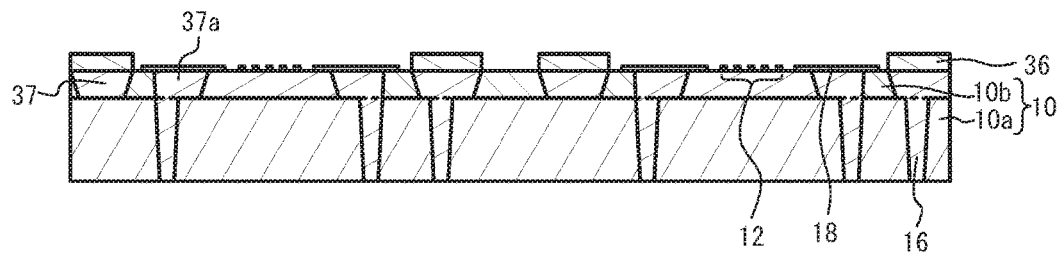

As illustrated in FIG. 7A, the ring-shaped electrodes 36 are formed on the ring-shaped metal layer 37. The ring-shaped electrodes 36 are formed of, for example, a titanium film and a nickel layer stacked in this order from the substrate 10 side, and are formed by evaporation and liftoff. As illustrated in FIG. 7B, the lower surface of the substrate 10 is polished or ground. This process exposes the via wirings 16 from the lower surface of the substrate 10.

Figure 7C:
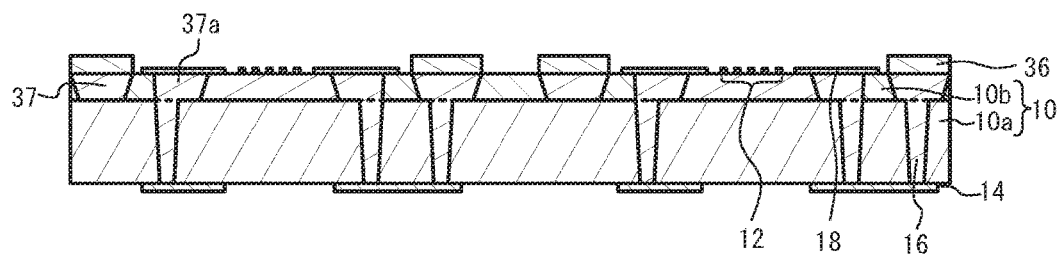

As illustrated in FIG. 7C, the terminals 14 are formed so as to make contact with the via wirings 16. For example, a seed layer is formed on the lower surface of the substrate 10. A photoresist having apertures is formed under the seed layer. An electric current is supplied to the seed layer, and a plated layer is formed in the apertures by electrolytic plating. The seed layer other than the plated layer is then removed. The seed layer is formed of, for example, a titanium film and a copper film stacked in this order from the substrate 10 side. The plated layer is formed of, for example, a copper layer, a nickel layer, and a gold layer stacked in this order from the substrate 10 side.

Figure 7D:
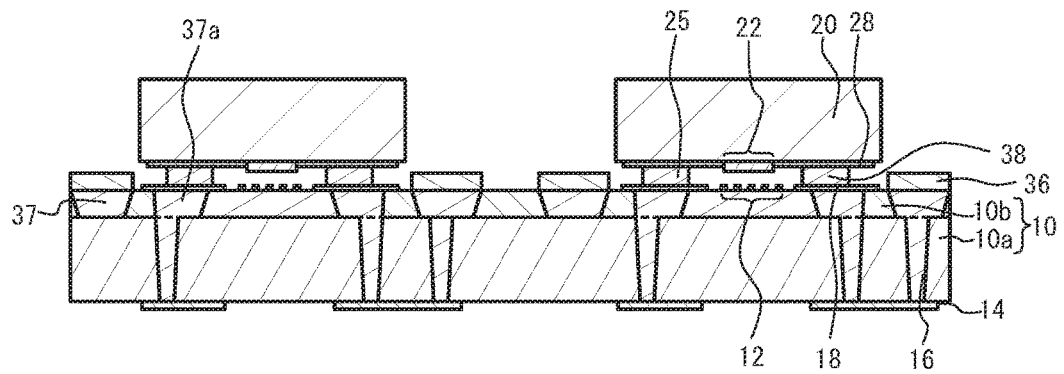

As illustrated in FIG. 7D, the substrates 20 are flip-chip mounted on the substrate 10. The substrate 20 is a chip after the separation into individual chips, and gold stud bumps as the bumps 38 are formed on the lower surface of the substrate 20.

Figure 8A:
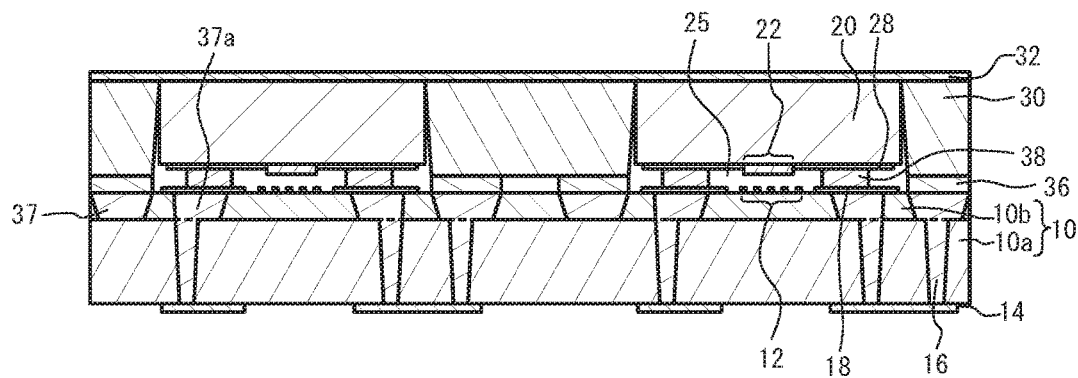
FIG. 8A through FIG. 8C are cross-sectional views (No. 3) illustrating the method of fabricating the acoustic wave device in accordance with the first embodiment.
Figure 9:
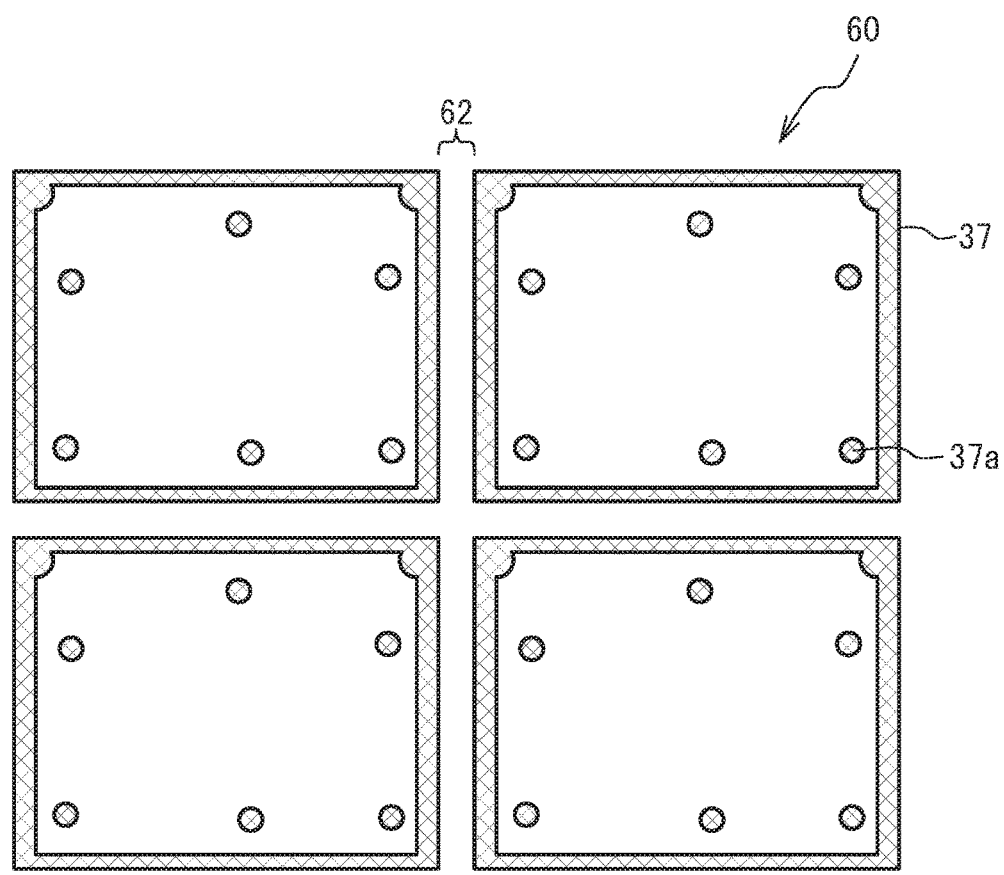
FIG. 9 is a plan view in FIG. 6C.

As illustrated in FIG. 8A, a solder plate is placed on the substrate 10 so as to cover the substrate 20. The lid 32 is placed on the solder plate. The solder plate is pressed to the substrate 10 by the lid 32, and the lid 32 is heated to a temperature greater than the melting point of the solder plate. This process melts the solder plate, forming the sealing member 30. Since the upper surface of the ring-shaped electrode 36 has a good solderability, the sealing member 30 is bonded to the substrate 10 through the ring-shaped electrode 36. Since the surface of the substrate 20 has a bad solderability, the sealing member 30 is not bonded to the side surface of the substrate 20 even when making contact with the side surface of the substrate 20. The lid 32 has a good solderability, and thus the sealing member 30 is bonded to the lid 32. The lid 32 makes contact with but is not bonded to the upper surface of the substrate 20.

Figure 8B:
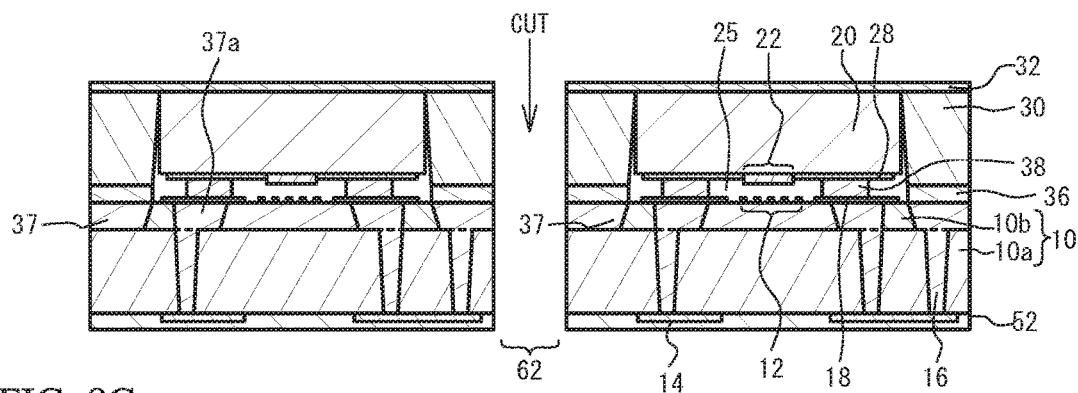
Figure 8C:
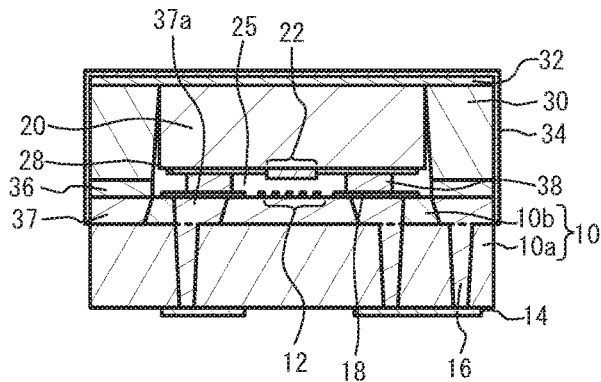

As illustrated in FIG. 8B, the lower surface of the substrate 10 is protected by a protective layer 52 such as a photoresist. The lid 32, the sealing member 30, and the substrate 10 in the cut region 62 are cut by dicing. Then, the protective layer 52 is removed. As illustrated in FIG. 8C, the protective film 34 is formed so as to cover the side surface of the sealing member 30. The protective film 34 is formed by, for example, barrel plating.

Figure 10:
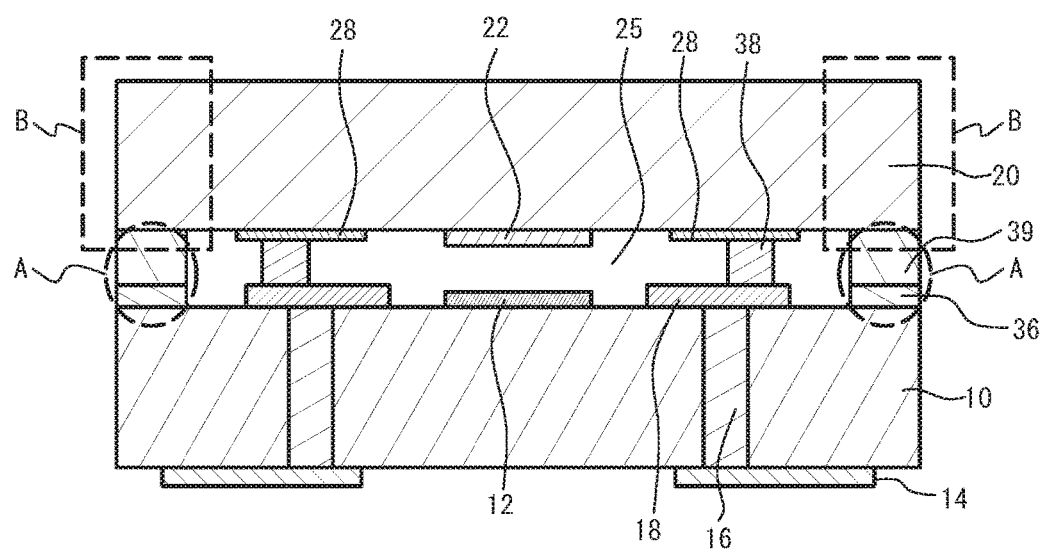
FIG. 10 is a cross-sectional view of an acoustic wave device in accordance with a first comparative example.

The effect of the first embodiment will be described by comparing to comparative examples. FIG. 10 is a cross-sectional view of an acoustic wave device in accordance with a first comparative example. As illustrated in FIG. 10, the functional element 12 is located on the upper surface of the substrate 10, and the functional element 22 is located on the lower surface of the substrate 20. The substrate 10 and the substrate 20 are bonded together with use of the ring-shaped electrode 36 and an interlayer 39. Other structures are the same as those of the first embodiment, and the description thereof is thus omitted.

In the first comparative example, the substrate 10 and the substrate 20 face each other across the interlayer 39, and are bonded together by the interlayer 39 (a region A). Thus, a stress is easily applied between the substrates 10 and 20. For example, when the substrates 10 and 20 have different linear thermal expansion coefficients, the thermal stress of the substrates 10 and 20 is applied. Thus, the substrate 10 strains. The strain of the substrate 10 deteriorates the characteristics of the functional element 12. In contrast, in the first embodiment, as illustrated in FIG. 1, the substrates 10 and 20 are bonded only to the bumps 38 in a region where the substrate 10 and the substrate 20 face each other. This structure makes it difficult for the stress to be applied between the substrates 10 and 20. Thus, the strain of the substrates 10 and 20 decreases. In the first embodiment, the substrate 20 does not have a region corresponding to the region B in FIG. 10 of the first comparative example. Thus, the substrate 20 can be reduced in size. Furthermore, in the first comparative example, the substrate 10 and the substrate 20 are bonded together in a wafer state. On the other hand, in the first embodiment, the substrate 20 in a chip state can be mounted on the substrate 10. This allows only good substrates 20 to be mounted on the substrate 10. Therefore, the yield ratio of the acoustic wave device can be increased.

Figure 11A:
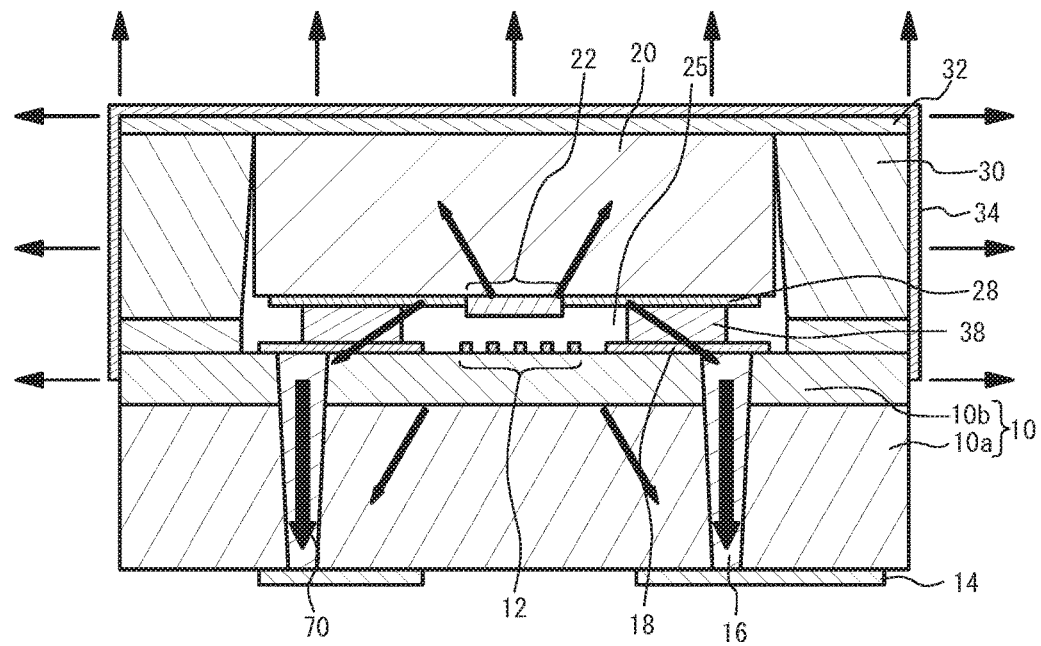
FIG. 11A and FIG. 11B are cross-sectional views of acoustic wave devices in accordance with a second comparative example and the first embodiment, respectively.
Figure 11B:
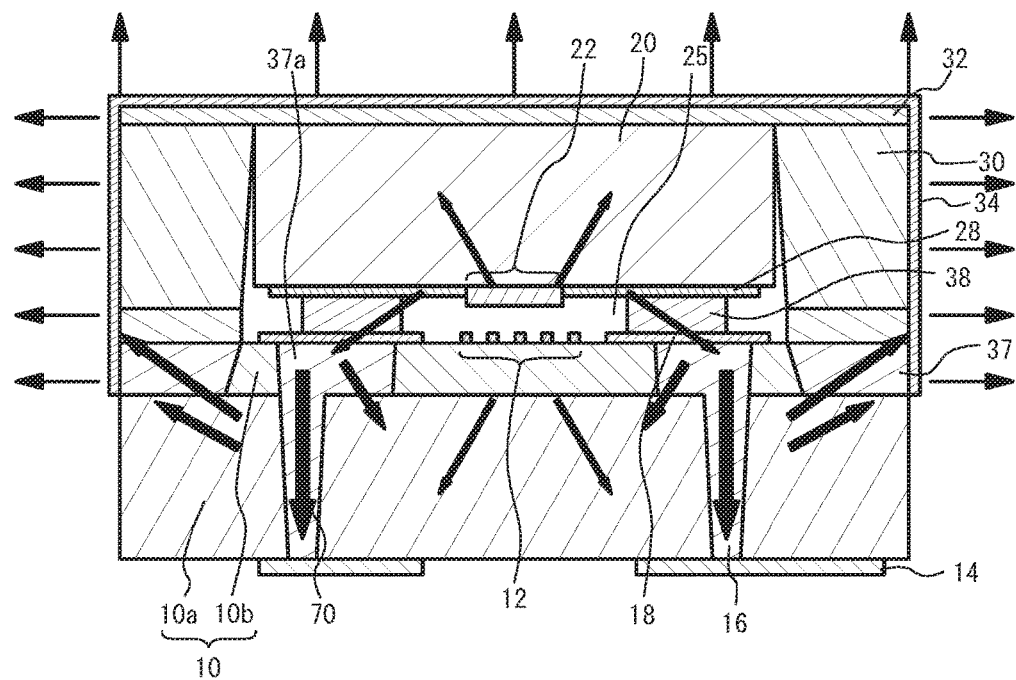

Next, compare to a second comparative example without the ring-shaped metal layer 37. FIG. 11A and FIG. 11B are cross-sectional views of acoustic wave devices in accordance with the second comparative example and the first embodiment. The acoustic wave device of the second comparative example illustrated in FIG. 11A differs from the acoustic wave device of the first embodiment illustrated in FIG. 11B in that the ring-shaped metal layer 37 is not provided and the piezoelectric substrate 10b is not removed. Arrows 70 in FIG. 11A and FIG. 11B indicate the conduction of heat. The width of the arrow represents the magnitude of the conduction of heat. The thermal conductivities of the materials exemplified in the first embodiment are as follows.
Sapphire: 42 W/m·K
Lithium tantalate: 2.8 W/m·K or less
Copper: 398 W/m·K
Sn3% Ag solder: 62.9 W/m·K The thermal conductivity of lithium tantalate is very small compared to other materials. Thus, as illustrated in FIG. 11A, the heat generated in the functional element 12 is mainly released from the lower surface of the support substrate 10a through the support substrate 10a and the via wiring 16. A part of the heat generated in the functional element 22 is released from the protective film 34 through the substrate 20. A part of the heat generated in the functional element 22 is also released from the lower surface of the support substrate 10a through the bump 38 and the via wiring 16. When the substrate 20 has a small thermal conductivity, and/or the substrate 20 and the sealing member 30 are not bonded together, the heat in the functional element 22 is less likely to be released through the sealing member 30. As described above, in the second comparative example, since the piezoelectric substrate 10b with a small thermal conductivity is located between the support substrate 10a and the sealing member 30 that have large thermal conductivities, the sealing member 30 does not contribute to the heat release so much.

As illustrated in FIG. 11B, in the first embodiment, the ring-shaped metal layer 37 with a large thermal conductivity is located between the support substrate 10a and the sealing member 30. Thus, the heat conducts from the support substrate 10a to the sealing member 30 through the ring-shaped metal layer 37. Thus, the heat is efficiently released from the sealing member 30. In addition, since the island metal layer 37a larger than the via wiring 16 is provided, the heat conducts to the support substrate 10a through the island metal layer 37a.

Figure 12A:
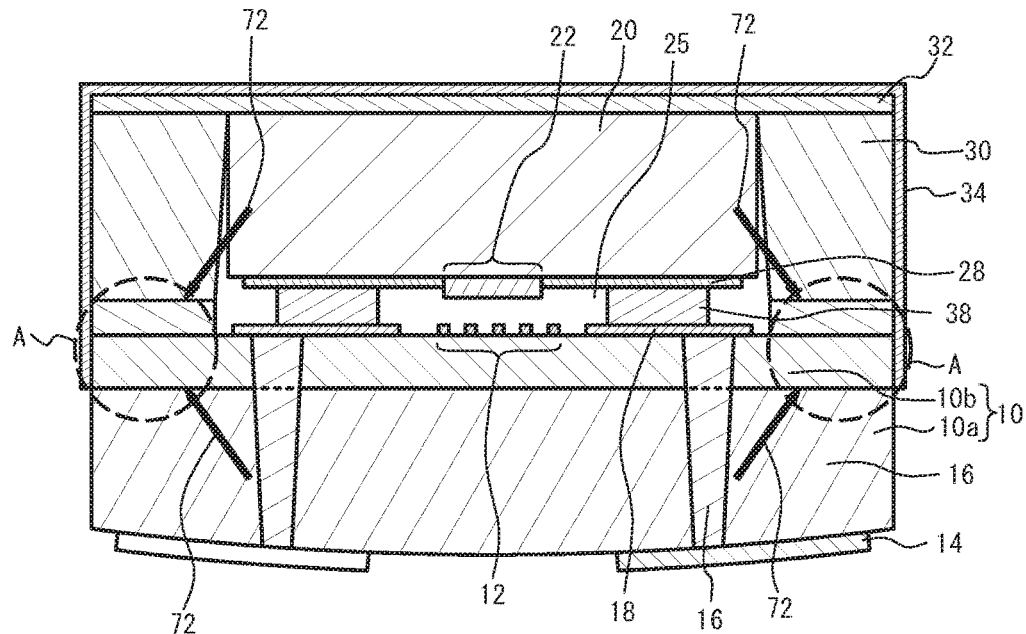
FIG. 12A and FIG. 12B are cross-sectional views of the acoustic wave devices in accordance with the second comparative example and the first embodiment, respectively.
Figure 12B:
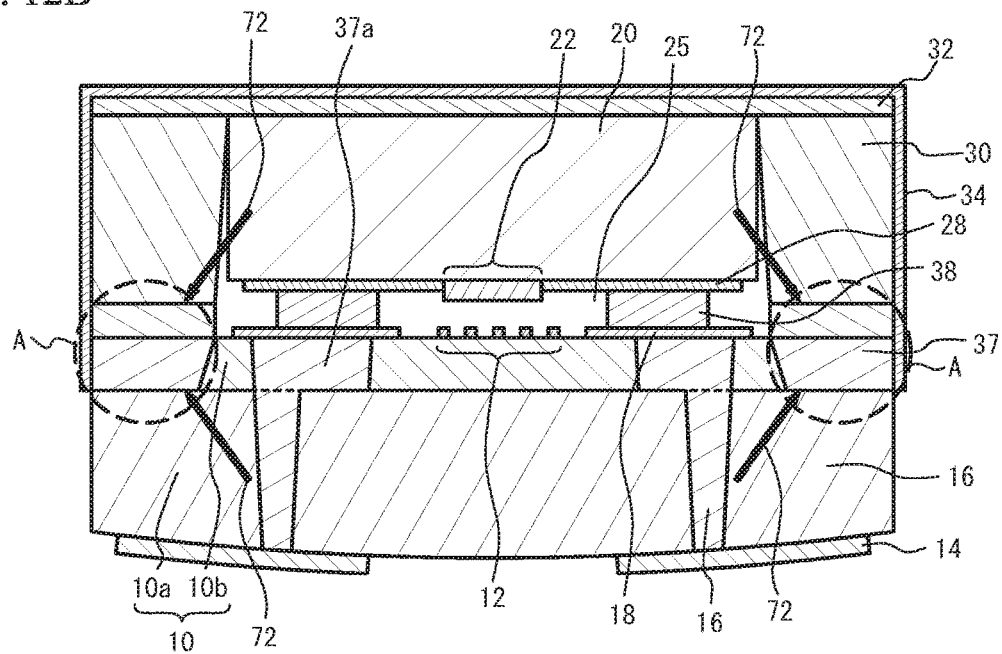

FIG. 12A and FIG. 12B are cross-sectional views of the acoustic wave devices in accordance with the second comparative example and the first embodiment. As illustrated in FIG. 12A and FIG. 12B, the stress (for example, thermal stress) applied between the substrates 10 and 20 concentrates in the region A in which the sealing member 30 makes contact with the substrate 10 as indicated by arrows 72. As illustrated in FIG. 12A, in the second comparative example, a stress is applied to the piezoelectric substrate 10b. Since the piezoelectric substrate 10b is weak, the piezoelectric substrate 10b may be damaged. For example, a crack may be formed in the piezoelectric substrate 10b. As illustrated in FIG. 12B, in the first embodiment, in the region A to which the stress is applied, the piezoelectric substrate 10b is removed and the ring-shaped metal layer 37 is provided. This structure can inhibit the piezoelectric substrate 10b from being damaged.

In the first embodiment, the substrate 10 (a first substrate) includes the support substrate 10a and the piezoelectric substrate 10b bonded on the upper surface of the support substrate 10a, and an acoustic wave element as the functional element 12 is located on the upper surface of the piezoelectric substrate 10b. The ring-shaped metal layer 37 is located in the region that surrounds the functional element 12 and in which the piezoelectric substrate 10b is removed. The substrate 20 (a second substrate) is flip-chip mounted on the upper surface of the substrate 10 through the bumps 38, and includes the functional element 22 located on the lower surface thereof. The sealing member 30, which is a metallic member, is located on the upper surface of the ring-shaped metal layer 37, surrounds the substrate 20 in plan view, and is not located between the substrate 10 and the substrate 20. The sealing member 30 seals the functional elements 12 and 22 so that the functional elements 12 and 22 are located across the air gap 25.

As described above, in the first embodiment, the sealing member 30 is not located between the substrates 10 and 20, and the substrates 10 and 20 are bonded together by the bumps 38. This structure can reduce a stress applied to the substrate 10 compared to that of the first comparative example of FIG. 10, and can reduce the deterioration of the characteristics of the functional element 12. In addition, metal has a higher thermal conductivity than a piezoelectric substance. Thus, as illustrated in FIG. 11A and FIG. 11B, the heat release performance is enhanced compared to that of the second comparative example. Furthermore, the piezoelectric substance is weaker than the support substrate 10a and metal. Thus, as illustrated in FIG. 12A and FIG. 12B, the damage to the piezoelectric substrate 10b can be reduced compared to that of the second comparative example.

In addition, the support substrate 10a has a thermal conductivity greater than the thermal conductivity of the piezoelectric substrate 10b. Thus, as illustrated in FIG. 11A and FIG. 11B, the heat release performance can be enhanced.

The support substrate 10a is a sapphire substrate, an alumina substrate, a spinel substrate, or a silicon substrate, and the piezoelectric substrate 10b is a lithium tantalate substrate or a lithium niobate substrate. Lithium tantalate and lithium niobate have greater thermal conductivities than sapphire, alumina, spinel, and silicon. Accordingly, as illustrated in FIG. 11A and FIG. 11B, the heat release performance is enhanced. Furthermore, lithium tantalate and lithium niobate are weaker than sapphire, alumina, spinel, silicon, and metal. Accordingly, as illustrated in FIG. 12A and FIG. 12B, the damage to the piezoelectric substrate 10b can be reduced.

Furthermore, the ring-shaped metal layer 37 is located so as to make contact with the upper surface of the support substrate 10a. This structure can enhance the heat release performance and/or reduce the damage to the piezoelectric substrate 10b.

The sealing member 30 is preferably bonded on the upper surface of the substrate 10, and is preferably not bonded to the side surface of the substrate 20. This structure can inhibit the stress of the substrate 20 from being applied to the sealing member 30. Accordingly, the stress of the substrate 20 can be inhibited from being applied to the substrate 10 through the sealing member 30.

The lid 32 is located on the upper surface of the substrate 20 and the upper surface of the sealing member 30. The lid 32 is preferably not bonded to the upper surface of the substrate 20, and is preferably bonded to the upper surface of the sealing member 30. This structure can inhibit the stress of the substrate 20 from being applied to the substrate 10 through the lid 32.

The substrates 10 and 20 are substrates with different linear thermal expansion coefficients. Thus, a thermal stress is easily applied between the substrates 10 and 20. The provision of the sealing member 30 can reduce the thermal stress between the substrates 10 and 20.

When the functional element 22 includes an acoustic wave element, the strain of the substrate 20 easily deteriorates the characteristics of the functional element 22. The provision of the sealing member 30 can reduce the deterioration of the characteristics of the functional element 22.

The terminal 14 is located on the lower surface of the substrate 10, and the wiring line such as the via wiring 16 connects the terminal 14 and the functional element 12. This structure allows the functional element 12 and the terminal 14 to be electrically connected.

Furthermore, the island metal layer 37a is surrounded by the ring-shaped metal layer 37, and is located in a region in which the piezoelectric substrate 10b is removed. The via wiring 16 penetrates through the support substrate 10a, and connects the terminal 14 and the island metal layer 37a. The via wiring 16 is smaller than the island metal layer 37a in plan view. Since the via wiring 16 penetrates through the support substrate 10a, the via wiring 16 cannot be increased in size. Thus, the island metal layer 37a is formed so as to be larger than the via wiring 16. This structure allows the heat to easily conduct between the wiring line 18 and the support substrate 10a through the island metal layer 37a.

The functional element 12 may include a receive filter, and the functional element 22 may include a transmit filter, but the functional element 12 preferably includes a transmit filter, and the functional element 22 preferably includes a receive filter. The heat generated in the functional elements 12 and 22 is mainly released from the lower surface of the substrate 10. Thus, by providing a transmit filter, which releases larger heat, on the substrate 10, the heat release through the substrate 10 becomes possible.

Second Embodiment

Figure 13:
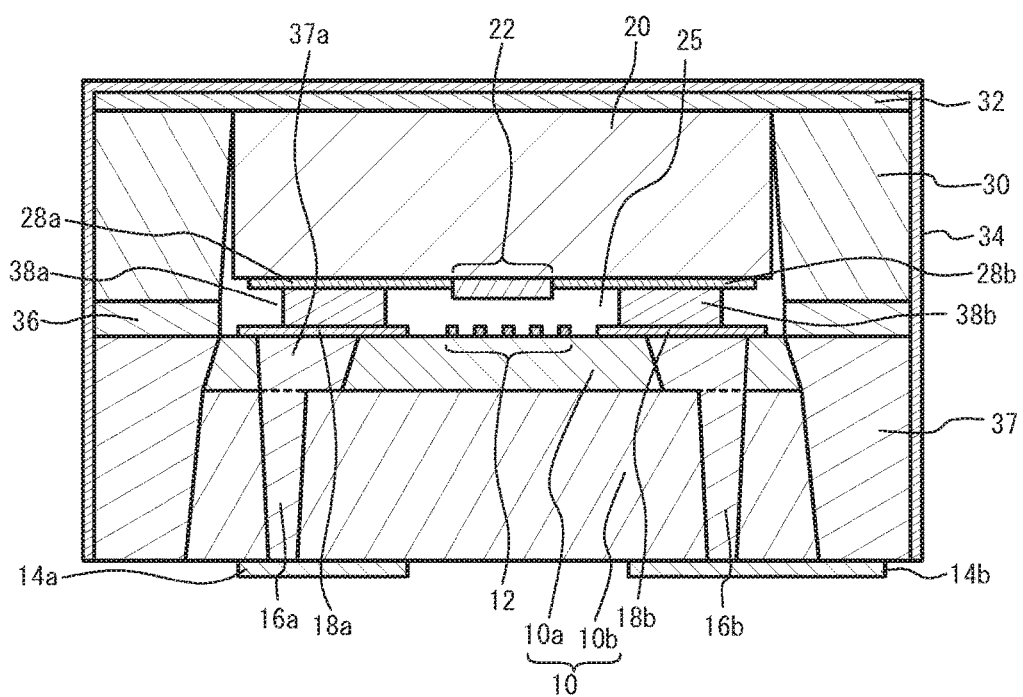
FIG. 13 is a cross-sectional view of an acoustic wave device in accordance with a second embodiment.

FIG. 13 is a cross-sectional view of an acoustic wave device in accordance with a second embodiment. As illustrated in FIG. 13, the support substrate 10a is circularly removed in addition to the piezoelectric substrate 10b, and the ring-shaped metal layer 37 is located instead. Other structures are the same as those of the first embodiment, and the description thereof is thus omitted.

Figure 14A:
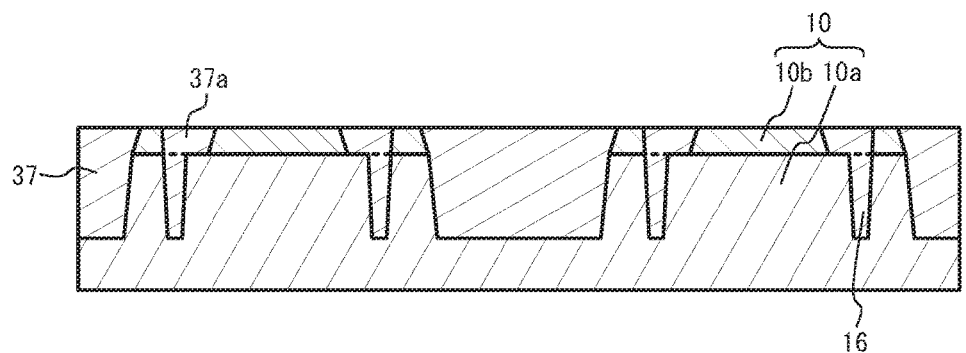
FIG. 14A through FIG. 14C are cross-sectional views illustrating a method of fabricating the acoustic wave device in accordance with the second embodiment.
Figure 14B:
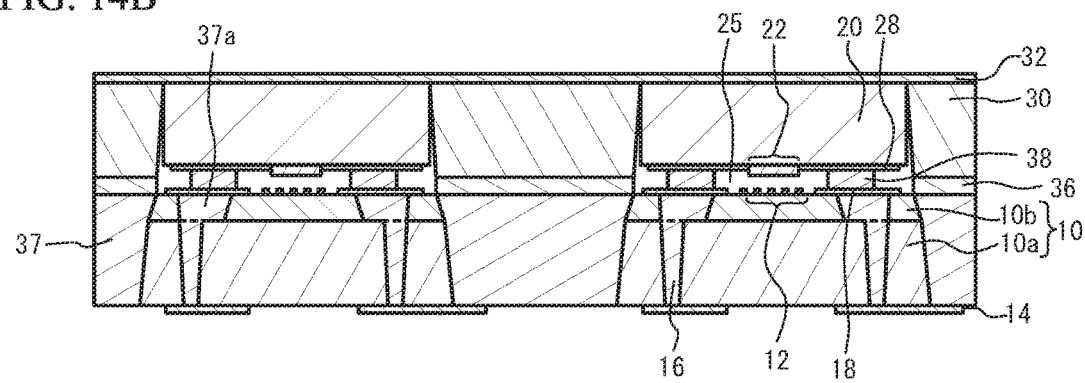
Figure 14C:
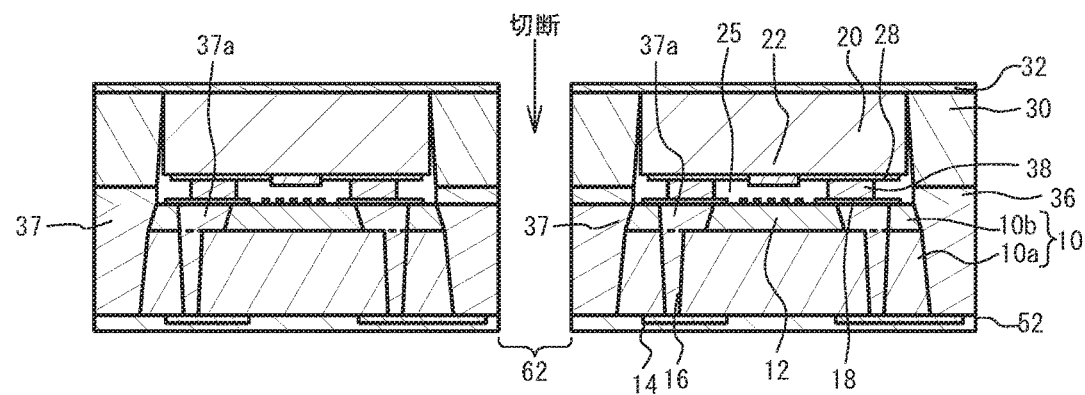
Figure 15:
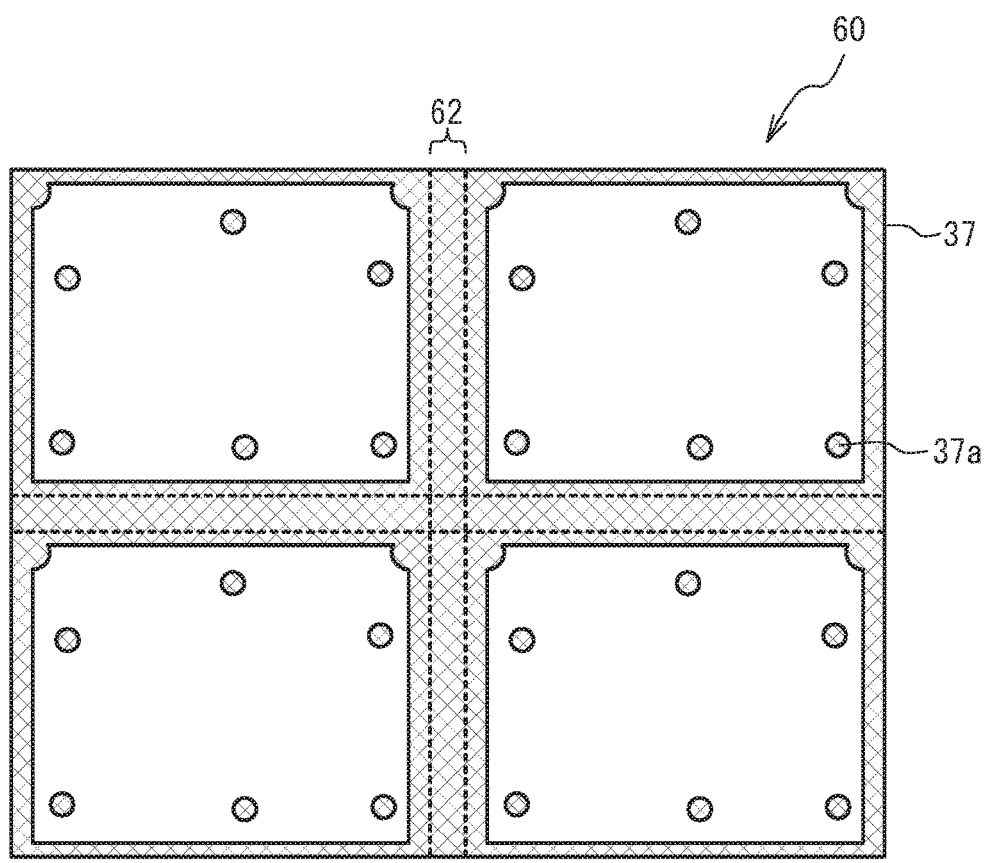
FIG. 15 is a plan view in FIG. 14A.

FIG. 14A through FIG. 14C are cross-sectional views illustrating a method of fabricating the acoustic wave device in accordance with the second embodiment. FIG. 15 is a plan view in FIG. 14A. As illustrated in FIG. 14A, after the step illustrated in FIG. 6B of the first embodiment, via holes and ring-shaped grooves are formed in the piezoelectric substrate 10b and the support substrate 10a. The via wirings 16 are formed in the via holes, and the ring-shaped metal layer 37 is formed in the ring-shaped grooves. As illustrated in FIG. 15, the ring-shaped metal layer 37 is also formed in the cut regions 62 between the regions 60. As illustrated in FIG. 14B, the steps from FIG. 6D through FIG. 8A in the first embodiment are performed. The lower surface of the support substrate 10a and the lower surface of the ring-shaped metal layer 37 become substantially flat. As illustrated in FIG. 14C, the cut regions 62 are cut. Thereafter, the step in FIG. 8C of the first embodiment is performed.

In the second embodiment, the ring-shaped metal layer 37 makes contact with the side surface of the support substrate 10a and penetrates through the support substrate 10a. This structure allows for the heat release through the ring-shaped metal layer 37. In addition, the sealing member 30 can be grounded through the ring-shaped metal layer 37, and thus, the sealing member 30 can be grounded more strongly. Furthermore, as illustrated in FIG. 14C, the support substrate 10a needs not cutting. Thus, the separation into individual chips can be easily performed regardless of the kind of the support substrate 10a. For example, when the support substrate 10a is a sapphire substrate, an alumina substrate, or a spinel substrate, since the support substrate 10a is hard, the support substrate 10a is difficult to cut. In the second embodiment, since the ring-shaped metal layer 37, which is soft, is cut, the separation into individual chips becomes easy.

In the first and second embodiments, the functional element 22 may include a surface acoustic wave resonator. In this case, the substrate 20 is, for example, a lithium tantalate substrate or a lithium niobate substrate. Alternatively, the functional element 22 may be an active element such as an amplifier and/or a switch. Alternatively, the substrate 20 is, for example, a silicon substrate. In addition, the functional element 22 may be a passive element such as an inductor and/or a capacitor. In this case, the substrate 20 is, for example, a silicon substrate or a glass substrate.

Although the embodiments of the present invention have been described in detail, it is to be understood that the various change, substitutions, and alterations could be made hereto without departing from the spirit and scope of the invention.

What is claimed is:

1. An acoustic wave device comprising:
   a first substrate that includes a support substrate and a piezoelectric substrate bonded on an upper surface of the support substrate, and includes a first acoustic wave element located on an upper surface of the piezoelectric substrate;
   a ring-shaped metal layer located in a region that surrounds the first acoustic wave element and in which the piezoelectric substrate is not located;
   a second substrate that is flip-chip mounted on an upper surface of the first substrate and includes a functional element located on a lower surface of the second substrate; and
   a metallic member that is located on an upper surface of the ring-shaped metal layer, surrounds the second substrate in plan view, is not located between the first substrate and the second substrate, and seals the first acoustic wave element and the functional element so that the first acoustic wave element and the functional element are located across an air gap,
   wherein a side surface of the ring-shaped metal layer makes contact with a side surface of the piezoelectric substrate.

2. The acoustic wave device according to claim 1, wherein a thermal conductivity of the support substrate is greater than a thermal conductivity of the piezoelectric substrate.

3. The acoustic wave device according to claim 1, wherein the support substrate is a sapphire substrate, an alumina substrate, a spinel substrate, or a silicon substrate, and the piezoelectric substrate is a lithium tantalate substrate or a lithium niobate substrate.

4. The acoustic wave device according to claim 1, wherein the ring-shaped metal layer makes contact with the upper surface of the support substrate.

5. The acoustic wave device according to claim 1, wherein the ring-shaped metal layer penetrates through the support substrate.

6. The acoustic wave device according to claim 1, further comprising:
   a lid located on an upper surface of the second substrate and an upper surface of the metallic member.

7. The acoustic wave device according to claim 1, further comprising:
   a terminal located on a lower surface of the first substrate; and
   a wiring line connecting the terminal and the first acoustic wave element.

8. The acoustic wave device according to claim 1, wherein the metallic member is made of solder.

9. An acoustic wave device comprising:
   a first substrate that includes a support substrate and a piezoelectric substrate bonded on an upper surface of the support substrate, and includes a first acoustic wave element located on an upper surface of the piezoelectric substrate;
   a ring-shaped metal layer located in a region that surrounds the first acoustic wave element and in which the piezoelectric substrate is not located;
   a second substrate that is flip-chip mounted on an upper surface of the first substrate and includes a functional element located on a lower surface of the second substrate; and
   a metallic member that is located on an upper surface of the ring-shaped metal layer, surrounds the second substrate in plan view, is not located between the first substrate and the second substrate, and seals the first acoustic wave element and the functional element so that the first acoustic wave element and the functional element are located across an air gap,
   wherein the functional element includes a second acoustic wave element.

10. The acoustic wave device according to claim 9, further comprising:
    a transmit filter connected between a common terminal and a transmit terminal;
    a receive filter connected between the common terminal and a receive terminal, wherein
    the first acoustic wave element includes the transmit filter, and
    the second acoustic wave element includes the receive filter.

11. An acoustic wave device comprising:
    a first substrate that includes a support substrate and a piezoelectric substrate bonded on an upper surface of the support substrate, and includes a first acoustic wave element located on an upper surface of the piezoelectric substrate;
    a ring-shaped metal layer located in a region that surrounds the first acoustic wave element and in which the piezoelectric substrate is not located;
    a second substrate that is flip-chip mounted on an upper surface of the first substrate and includes a functional element located on a lower surface of the second substrate;
    a metallic member that is located on an upper surface of the ring-shaped metal layer, surrounds the second substrate in plan view, is not located between the first substrate and the second substrate, and seals the first acoustic wave element and the functional element so that the first acoustic wave element and the functional element are located across an air gap;
    an island metal layer that is surrounded by the ring-shaped metal layer, is located in a region in which the piezoelectric substrate is not located, and is coupled to the first acoustic wave element;
    a terminal located on a lower surface of the first substrate; and
    a via wiring that penetrates through the support substrate, connects the terminal and the island metal layer, and is smaller than the island metal layer in plan view.

* * * * *